United States Patent
Mei et al.

(10) Patent No.: US 10,347,836 B2
(45) Date of Patent: Jul. 9, 2019

(54) QLED DEVICE AND MANUFACTURING METHOD THEREOF, QLED DISPLAY PANEL AND QLED DISPLAY DEVICE

(71) Applicant: BOE TECHNOLOGY GROUP CO., LTD., Beijing (CN)

(72) Inventors: Wenhai Mei, Beijing (CN); Zhuo Chen, Beijing (CN); Yuanming Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/865,502

(22) Filed: Jan. 9, 2018

(65) Prior Publication Data
US 2018/0294414 A1  Oct. 11, 2018

(30) Foreign Application Priority Data

Apr. 7, 2017 (CN) .......................... 2017 1 0224387

(51) Int. Cl.
*H01L 51/50* (2006.01)
*H01L 51/00* (2006.01)
*H01L 21/02* (2006.01)

(52) U.S. Cl.
CPC .... *H01L 51/0007* (2013.01); *H01L 21/02109* (2013.01); *H01L 51/0003* (2013.01); *H01L 51/0092* (2013.01); *H01L 51/502* (2013.01)

(58) Field of Classification Search
CPC .......................... H01L 51/0007; H01L 51/502
See application file for complete search history.

(56) References Cited

U.S. PATENT DOCUMENTS

| 2008/0202579 | A1* | 8/2008 | Gur ........................ B82Y 30/00 136/252 |
| 2011/0140075 | A1 | 6/2011 | Zhou et al. |
| 2014/0182666 | A1* | 7/2014 | Teng .................... H01G 9/2072 136/254 |
| 2016/0233449 | A1* | 8/2016 | Murayama ........... C09K 11/565 |

(Continued)

FOREIGN PATENT DOCUMENTS

| CN | 105070849 A | 11/2015 |
| CN | 105098075 A | 11/2015 |

(Continued)

OTHER PUBLICATIONS

First Office Action for Chinese Patent Application No. 201710224387.2 dated Jan. 29, 2018.

(Continued)

*Primary Examiner* — Dung A. Le
(74) *Attorney, Agent, or Firm* — Calfee, Halter & Griswold LLP

(57) ABSTRACT

A QLED device and manufacturing method thereof, a QLED display panel and a QLED display device are disclosed which improve the surface and internal structure of the quantum dot layer in the QLED devices. The method for manufacturing a QLED device includes forming a first electrode layer; forming a quantum dot layer on the first electrode layer; infiltrating a mixed solvent containing a bifunctional molecule into the quantum dot layer so as to improve the structure of the quantum dot layer; and forming a second electrode layer on the quantum dot layer.

15 Claims, 5 Drawing Sheets

(56) References Cited

U.S. PATENT DOCUMENTS

| | | | |
|---|---|---|---|
| 2018/0047924 A1* | 2/2018 | Xu | G02F 1/1333 |
| 2018/0072942 A1* | 3/2018 | Yamada | C09K 11/08 |
| 2018/0114936 A1* | 4/2018 | Hao | H01L 51/5004 |
| 2018/0158997 A1* | 6/2018 | Neyts | B82Y 40/00 |

FOREIGN PATENT DOCUMENTS

| | | |
|---|---|---|
| CN | 105655495 A | 6/2016 |
| CN | 106206972 A | 12/2016 |
| CN | 106328822 A | 1/2017 |
| WO | 2011044391 A1 | 4/2011 |

OTHER PUBLICATIONS

Second Office Action for Chinese Patent Application No. 201710224387.2 dated Sep. 21, 2018.

* cited by examiner

QLED DEVICE AND MANUFACTURING METHOD THEREOF, QLED DISPLAY PANEL AND QLED DISPLAY DEVICE

RELATED APPLICATIONS

The present application claims the benefit of Chinese Patent Application No. 201710224387.2, filed on Apr. 7, 2017, the entire disclosures of which are incorporated herein by reference.

TECHNICAL FIELD

The present disclosure relates to the field of display technology, and particularly to a QLED device and manufacturing method thereof, a QLED display panel and a QLED display device.

BACKGROUND

Quantum dots (QDs) are nanocrystalline particles with a radius less than or near the exciton Bohr radius and typically have a size particle size between 1 nm and 20 nm. Quantum dots have a quantum confinement effect and emit fluorescence when excited. Moreover, quantum dots have unique luminescence properties such as wide excitation peak width, narrow emission peak and tunable luminescence spectrum, which provide promising applications in the fields of photoluminescence and electroluminescence. A quantum dot light emitting diode (QLED) is a device that uses colloidal quantum dots as a light emitting layer and introduces the light emitting layer between different conductive materials to obtain light of a desired wavelength. QLED has advantages such as high color gamut, self-illumination, low starting voltage, quick response and so on; therefore currently it is a very hot research direction.

SUMMARY

According to an aspect of the present disclosure, an embodiment of the present disclosure provides a method for manufacturing a QLED device. The method comprises: forming a first electrode layer; forming a quantum dot layer on the first electrode layer; infiltrating a mixed solvent containing a bifunctional molecule into the quantum dot layer so as to improve the structure of the quantum dot layer; and forming a second electrode layer on the quantum dot layer.

In certain exemplary embodiments, the step of infiltrating the mixed solvent containing the bifunctional molecule into the quantum dot layer comprises: arranging the mixed solvent on the quantum dot layer; and raising temperature to a predetermined value.

In certain exemplary embodiments, the step of infiltrating the mixed solvent containing the bifunctional molecule into the quantum dot layer further comprises: rotating or vibrating the quantum dot layer.

In certain exemplary embodiments, the step of infiltrating the mixed solvent containing the bifunctional molecule into the quantum dot layer further comprises: performing an annealing process on the quantum dot layer.

In certain exemplary embodiments, a host material of the quantum dot layer is CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

In certain exemplary embodiments, the mixed solvent is composed of a benign solvent and a poor solvent of a host material of the quantum dot layer.

In certain exemplary embodiments, a material of the mixed solvent is selected from one of the following combinations: n-hexane/acetone, n-hexane/n-butanol, n-hexane/isopropanol, toluene/acetone, toluene/n-butanol, and toluene/isopropanol.

In certain exemplary embodiments, a volume ratio of the benign solvent to the poor solvent is in a range of 10:1 to 1:10.

In certain exemplary embodiments, the bifunctional molecule is ethylene glycol, 1,3-propanediol, ethanedithiol, or 1,3-propanedithiol.

In certain exemplary embodiments, a mass percentage of the bifunctional molecule in the mixed solvent is in a range of 1% to 10%.

In certain exemplary embodiments, the first electrode layer comprises an anode layer, a hole injection layer and a hole transport layer; and the step of forming the first electrode layer comprises: forming the anode layer, the hole injection layer and the hole transport layer sequentially; the second electrode layer comprises a cathode layer, an electron injection layer and an electron transport layer; and the step of forming the second electrode layer comprises: forming the electron transport layer, the electron injection layer and cathode layer sequentially.

According to another aspect of the present disclosure, an embodiment of the present disclosure provides a QLED device manufactured by the above mentioned method. The QLED device comprises a first electrode layer, a quantum dot layer and a second electrode layer stacked sequentially. The quantum dot layer comprises a bifunctional molecule.

In certain exemplary embodiments, a host material of the quantum dot layer is CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

In certain exemplary embodiments, the bifunctional molecule is ethylene glycol, 1,3-propanediol, ethanedithiol, or 1,3-propanedithiol.

According to yet another aspect of the present disclosure, an embodiment of the present disclosure provides a QLED display panel. The QLED display panel comprises a substrate and a plurality of above mentioned QLED devices arranged in an array on a surface of the substrate.

According to another aspect of the present disclosure, an embodiment of the present disclosure provides a QLED display device. The QLED display device comprises the QLED display panel according to the above mentioned embodiment.

DETAILED DESCRIPTION OF THE EMBODIMENTS

Figure 1:
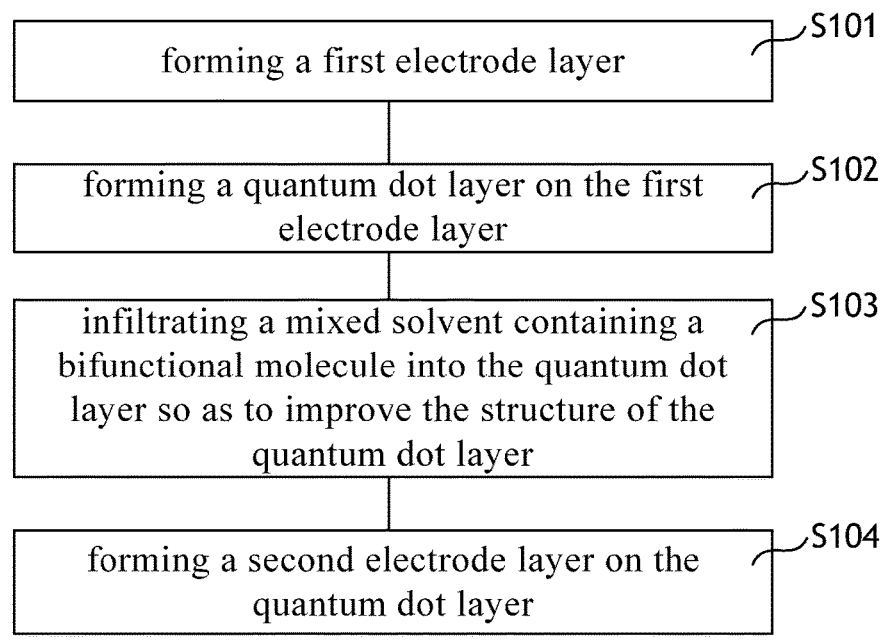
FIG. 1 is a flowchart of a method for manufacturing a QLED device according to an embodiment of the present disclosure.

In the following, the technical solutions in embodiments of the disclosure will be described clearly and completely in connection with the drawings in the embodiments of the disclosure. Obviously, the described embodiments are only part of the embodiments of the disclosure, and not all of the embodiments. Based on the embodiments in the disclosure, all other embodiments obtained by those of ordinary skills in the art under the premise of not paying out creative work pertain to the protection scope of the disclosure.

The efficiency of current QLEDs is generally low. An important factor affecting the QLED efficiency is that the quantum dot light emitting layer has many defects in the surface and interior, thus the quantum dot light emitting layer cannot form a regular and compact quantum dot film. The resulting defects lead to the formation of a large number of "dead ends" inside the quantum dot layer, resulting in the carriers being trapped in the dead end and unable to recombine to emit light. A few studies have been devoted to solving the problem of film formation for the quantum dot layer. For example, the film can be regular and compact by ligand exchange and cross-linking of the film surface. However, the above methods may raise a new problem: for example, the energy level of the quantum dot layer may change after ligand exchange, which affects the injection of carriers and the like.

In addition, most studies focus on making the surface of the quantum dot layer regular and compact, and there are relatively few studies on the alignment and arrangement of the internal structure of the quantum dot layer. The internal structure of the quantum dot layer plays a very crucial role in carrier transport, so it is necessary to make further improvements in this aspect.

For the quantum dot layer formed by a conventional process, the surface of the quantum dot layer is uneven with a large number of internal defects and gaps. This lead to a part of the quantum dots cannot be closely linked together, and the carriers are thus trapped in the dead end and cannot compound to emit light. Therefore, in the embodiments of the present disclosure, bifunctional molecules are dissolved in a mixed solvent. The bifunctional molecules can strongly interact with quantum dots. After infiltrating the interior of the quantum dot layer, bifunctional molecules can form bridges between loose quantum dots, making the arrangement of quantum dots more compact. In this way, the regularity and compactness of the surface and the interior of the quantum dot layer are well improved, thereby improving the quantum efficiency and the spectral characteristics of the quantum dot light emitting device.

To this end, the embodiments of the present disclosure provide a QLED device and manufacturing method thereof, a QLED display panel and a QLED display device, improving the surface and internal structure of the quantum dot layer in the QLED devices.

According to an aspect of the present disclosure, an embodiment of the present disclosure provides a method for manufacturing a QLED device. As shown in FIG. 1 and FIG. 2a-FIG. 2e, the method comprises: S101 forming a first electrode layer 201, the first electrode layer 201 can e.g. be formed on a substrate 20 (shown in FIG. 2a); S102 forming a quantum dot layer 202 on the first electrode layer 201 (shown in FIG. 2b); S103 infiltrating a mixed solvent 204 containing a bifunctional molecule 203 into the quantum dot layer 202 so as to improve the structure of the quantum dot layer 202 (shown in FIG. 2c and FIG. 2d); and S104 forming a second electrode layer 205 on the quantum dot layer 202 (shown in FIG. 2e).

Figure 2A:
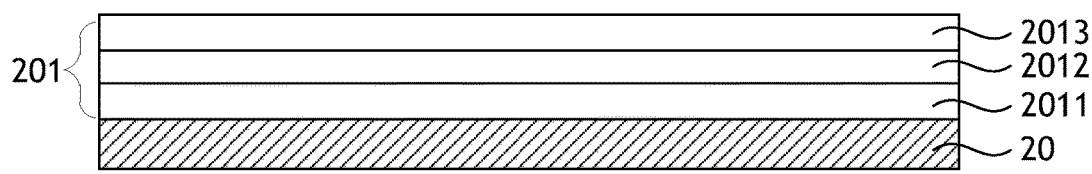
FIG. 2a-FIG. 2e are schematic diagrams of respective steps in a method for manufacturing a QLED device according to an embodiment of the present disclosure.
Figure 2B:
Figure 2C:
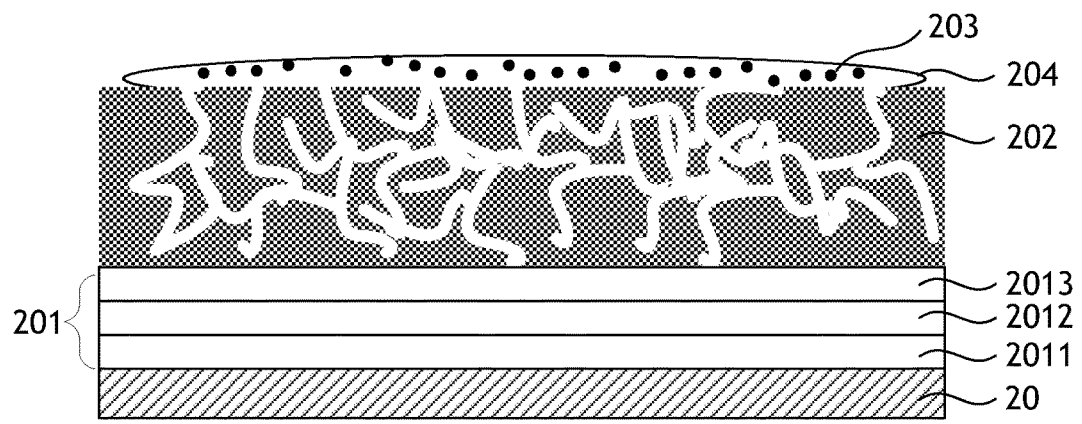
Figure 2D:
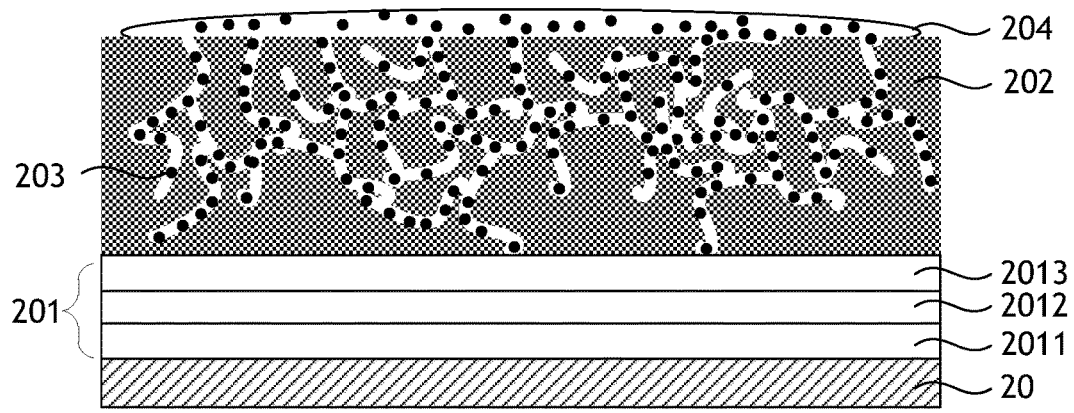

For the quantum dot layer formed by a conventional process, the surface of the quantum dot layer is uneven with a large number of internal defects and gaps (as shown with the white curves in FIG. 2b-FIG. 2d). This lead to a part of the quantum dots cannot be closely linked together. The carriers are thus trapped in the dead end and cannot compound to emit light. Therefore, in the embodiments of the present disclosure, bifunctional molecules are dissolved in a mixed solvent. The bifunctional molecules can strongly interact with quantum dots. After infiltrating the interior of the quantum dot layer, bifunctional molecules can form bridges between loose quantum dots, making the arrangement of quantum dots more compact. In this way, the regularity and compactness of the surface and the interior of the quantum dot layer are well improved, thereby improving the quantum efficiency and the spectral characteristics of the quantum dot light emitting device.

Figure 3:
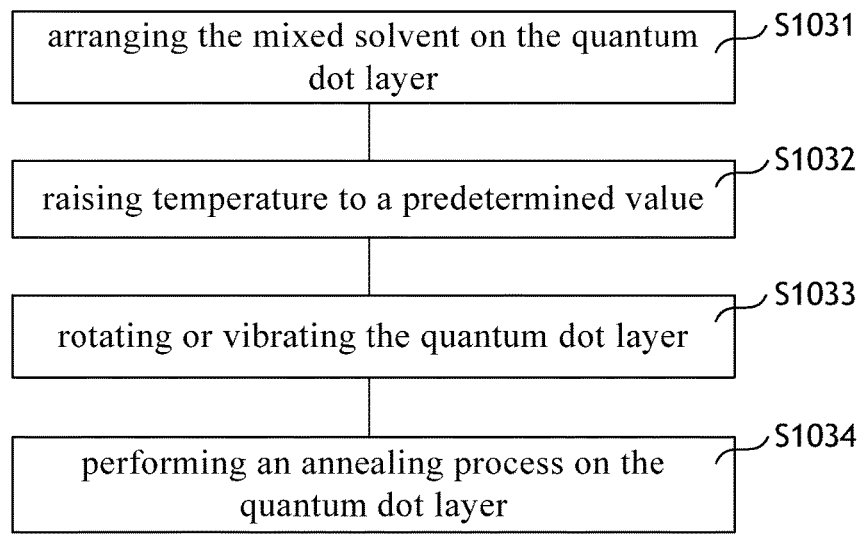
FIG. 3 showing steps of infiltrating a mixed solvent containing a bifunctional molecule into a quantum dot layer in a method for manufacturing a QLED device according to an embodiment of the present disclosure.

In certain exemplary embodiments, as shown in FIG. 3, the step of S103 infiltrating the mixed solvent containing the bifunctional molecule into the quantum dot layer comprises: S1031 arranging the mixed solvent on the quantum dot layer; and S1032 raising the temperature to a predetermined value.

In some embodiments, the mixed solvent can be applied to the surface of the quantum dot layer using e.g. spin-coating, and the mixed solvent cannot dissolve the quantum dot layer below room temperature (e.g., 25° C.). When the temperature rises to a certain critical temperature (i.e., a predetermined value), the mixed solvent begins to have a certain solubility for the quantum dot layer.

With the help of the solubility, the diffusion of the mixed solvent in the quantum dot layer is also enhanced. Therefore, at this critical temperature, the mixed solvent can slowly diffuse into the quantum dot layer without causing undesired damage to the quantum dot layer.

The critical temperature can be determined using an observing device such as a microscope for a particular mixed solvent and a particular quantum dot material. At a certain temperature, if it is observed that the surface of the quantum dot layer begins to dissolve, the temperature can be determined as the critical temperature. In an embodiment of the present disclosure, the critical temperature ranges from 30° C. to 120° C.

In certain exemplary embodiments, as shown in FIG. 3, the step of S103 infiltrating the mixed solvent containing the bifunctional molecule into the quantum dot layer further comprises: S1033 rotating or vibrating the quantum dot layer.

Figure 4:
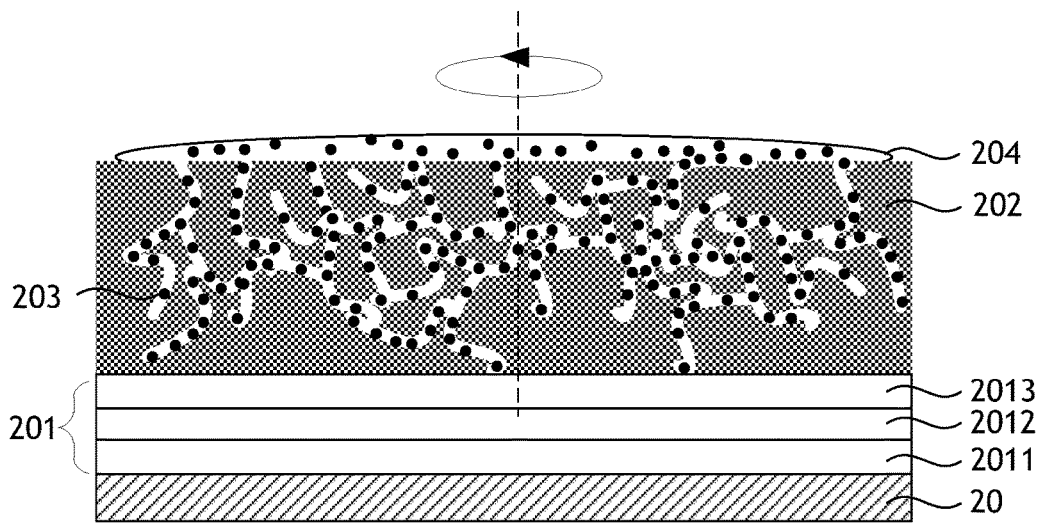
FIG. 4 is a schematic diagram of rotating a quantum dot layer.

In some embodiments, as shown in FIG. 4, the quantum dot layer can be rotated or vibrated after raising the temperature to the predetermined value. By applying the force of rotation or vibration, the bifunctional molecules can be diffused more adequately and contact the surrounding loose quantum dots, further enhancing the bond between the loose quantum dots. Moreover, by using a process such as rotation, it is also possible to remove excess mixed solvent and avoid undesired damage to the quantum dot layer.

In certain exemplary embodiments, as shown in FIG. 3, the step of S103 infiltrating the mixed solvent containing the bifunctional molecule into the quantum dot layer further comprises: S1034 performing an annealing process on the quantum dot layer.

In some embodiments, after the structure of the quantum dot layer is improved, an annealing process can be performed on the quantum dot layer. By using the annealing process, the remaining mixed solvent in the quantum dot layer can be removed, and the structure of the optimized quantum dot layer can also be fixedly molded.

In certain exemplary embodiments, a host material of the quantum dot layer (i.e., quantum dot material) is CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

In certain exemplary embodiments, the mixed solvent is composed of a benign solvent and a poor solvent of a host material of the quantum dot layer.

The mixed solvent is formed using a combination of a benign solvent and a poor solvent of the host material of the quantum dot layer, so as to facilitate control of the solubility of the quantum dot layer in the mixed solvent. According to the teaching of the embodiments of the present disclosure, it is possible to prepare a mixed solvent in which the quantum dot layer cannot be dissolved at or below room temperature (e.g., 25° C.), and then use the relationship between the temperature and the solubility to control diffusion of the mixed solvent in the quantum dot layer.

In certain exemplary embodiments, a material of the mixed solvent is selected from one of the following combinations: n-hexane/acetone, n-hexane/n-butanol, n-hexane/isopropanol, toluene/acetone, toluene/n-butanol, and toluene/isopropanol.

In the combinations listed above, the former component (e.g., n-hexane in the "n-hexane/acetone" combination) of each combination is a benign solvent for the host material of the quantum dot layer and the latter component (e.g., acetone in the "n-hexane/acetone" combination) is a poor solvent for the host material of the quantum dot layer.

In certain exemplary embodiments, a volume ratio of the benign solvent to the poor solvent is in a range of 10:1 to 1:10.

In certain exemplary embodiments, the bifunctional molecule is ethylene glycol, 1,3-propanediol, ethanedithiol, or 1,3-propanedithiol.

In certain exemplary embodiments, a mass percentage of the bifunctional molecule in the mixed solvent is in a range of 1% to 10%.

In certain exemplary embodiments, as shown in FIG. 2a, the first electrode layer 201 comprises an anode layer 2011, a hole injection layer 2012 and a hole transport layer 2013; and the step of forming the first electrode layer 201 comprises: forming the anode layer 2011, the hole injection layer 2012 and the hole transport layer 2013 sequentially. As shown in FIG. 2, the second electrode layer 205 comprises a cathode layer 2051, an electron injection layer 2052 and an electron transport layer 2053; and the step of forming the second electrode layer 205 comprises: forming the electron transport layer 2053, the electron injection layer 2052 and cathode layer 2051 sequentially.

Those skilled in the art can understand that the first electrode layer 201 and the second electrode layer 205 of the QLED device can also be arranged in other manners. Therefore, the present disclosure does not limit the specific structure and production method of the first electrode layer 201 and the second electrode layer 205.

Figure 2E:
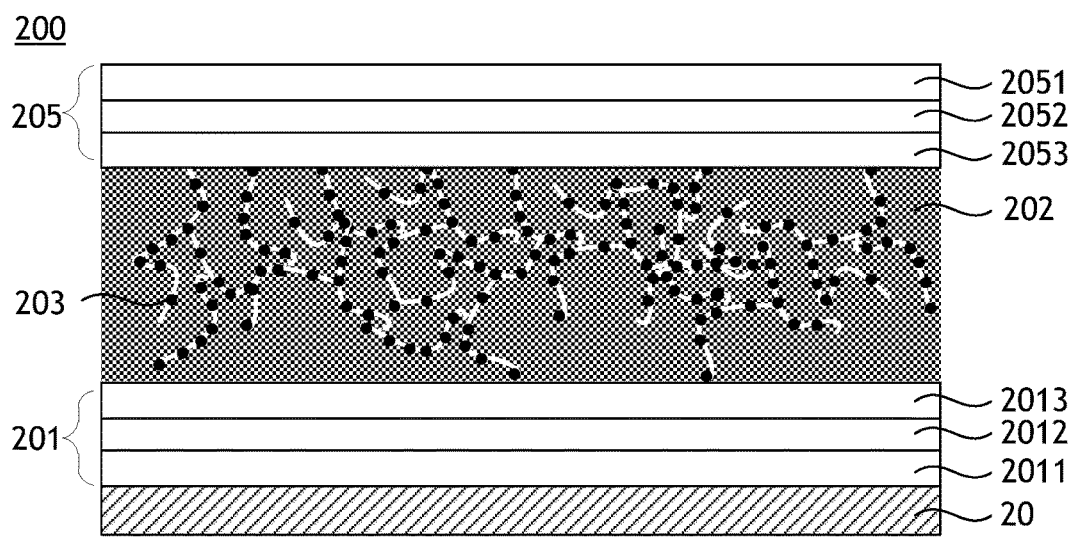

According to another aspect of the present disclosure, as shown in FIG. 2e, an embodiment of the present disclosure provides a QLED device 200 manufactured by the above mentioned method. The QLED device comprises a first electrode layer 201, a quantum dot layer 202 and a second electrode layer 205 stacked sequentially. The quantum dot layer 202 comprises a bifunctional molecule 203.

In the embodiment of the disclosure, the bifunctional molecules can form bridges between loose quantum dots, making the arrangement of quantum dots more compact. In this way, the regularity and compactness of the surface and the interior of the quantum dot layer are well improved, thereby improving the quantum efficiency and the spectral characteristics of the quantum dot light emitting device.

In certain exemplary embodiments, a host material of the quantum dot layer is CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

In certain exemplary embodiments, the bifunctional molecule is ethylene glycol, 1,3-propanediol, ethanedithiol, or 1,3-propanedithiol.

Figure 5:
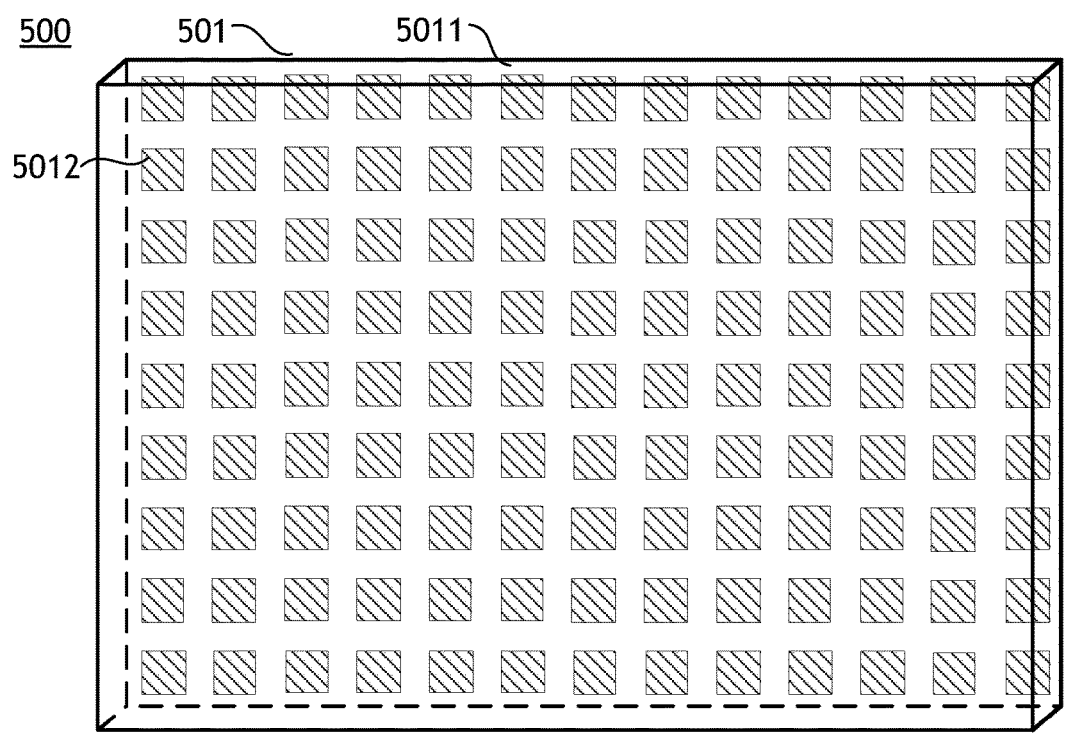
FIG. 5 is a schematic diagram of a QLED display panel and a QLED display device according to an embodiment of the present disclosure.

According to yet another aspect of the present disclosure, as shown in FIG. 5, an embodiment of the present disclosure provides a QLED display panel 501. The QLED display panel 501 comprises a substrate 5011 and a plurality of above mentioned QLED devices 5012 arranged in an array on a surface of the substrate 5011. Since the principle of the QLED display panel for solving the problem is similar to that of the QLED device, the implementation of the QLED display panel can be referred to the implementation of the QLED device, which will not be repeated herein.

According to another aspect of the present disclosure, as shown in FIG. 5, an embodiment of the present disclosure provides a QLED display device 500. The QLED display device 500 comprises the QLED display panel 501 according to the above mentioned embodiment. The QLED display device 500 can further include necessary packaging components and control circuits, which are not limited herein. Since the principle of the QLED display device for solving the problem is similar to that of the QLED device, the implementation of the QLED device can be referred to the implementation of the QLED device, which will not be repeated herein.

According to the QLED device, the method for manufacturing the QLED device, the QLED display panel and the QLED display device provided in the embodiments of the present disclosure, bifunctional molecules are dissolved in a mixed solvent. The bifunctional molecules can strongly interact with quantum dots. After infiltrating the interior of the quantum dot layer, bifunctional molecules can form bridges between loose quantum dots, making the arrangement of quantum dots more compact. In this way, the regularity and compactness of the surface and the interior of the quantum dot layer are well improved, thereby improving the quantum efficiency and the spectral characteristics of the quantum dot light emitting device Apparently, the person skilled in the art may make various alterations and variations to the disclosure without departing the spirit and scope of the disclosure. As such, provided that these modifications and variations of the disclosure pertain to the scope of the claims of the disclosure and their equivalents, the disclosure is intended to embrace these alterations and variations.

What is claimed is:

1. A method for manufacturing a QLED device, comprising:

forming a first electrode layer;

forming a quantum dot layer on the first electrode layer;

infiltrating a mixed solvent containing a bifunctional molecule into the quantum dot layer so as to increase regularity and compactness of the quantum dot layer; and forming a second electrode layer on the quantum dot layer.

2. The method according to claim 1, wherein the step of infiltrating the mixed solvent containing the bifunctional molecule into the quantum dot layer comprises:

arranging the mixed solvent on the quantum dot layer; and
raising temperature to a predetermined value.

3. The method according to claim 2, wherein the step of infiltrating the mixed solvent containing the bifunctional molecule into the quantum dot layer further comprises:

rotating or vibrating the quantum dot layer.

4. The method according to claim 3, wherein the step of infiltrating the mixed solvent containing the bifunctional molecule into the quantum dot layer further comprises:

performing an annealing process on the quantum dot layer.

5. The method according to claim 1, wherein a host material of the quantum dot layer is CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

6. The method according to claim 1, wherein the mixed solvent is composed of a benign solvent and a poor solvent of a host material of the quantum dot layer.

7. The method according to claim 6, wherein a material of the mixed solvent is selected from one of the following combinations: n-hexane/acetone, n-hexane/n-butanol, n-hexane/isopropanol, toluene/acetone, toluene/n-butanol, and toluene/isopropanol.

8. The method according to claim 6, wherein a volume ratio of the benign solvent to the poor solvent is in a range of 10:1 to 1:10.

9. The method according to claim 1, wherein the bifunctional molecule is ethylene glycol, 1,3-propanediol, ethanedithiol, or 1,3-propanedithiol.

10. The method according to claim 9, wherein a mass percentage of the bifunctional molecule in the mixed solvent is in a range of 1% to 10%.

11. The method according to claim 1, wherein the first electrode layer comprises an anode layer, a hole injection layer and a hole transport layer; and the step of forming the first electrode layer comprises: forming the anode layer, the hole injection layer and the hole transport layer sequentially; the second electrode layer comprises a cathode layer, an electron injection layer and an electron transport layer; and the step of forming the second electrode layer comprises: forming the electron transport layer, the electron injection layer and cathode layer sequentially.

12. The method according to claim 2, wherein a host material of the quantum dot layer is CdS, CdSe, ZnSe, InP, PbS, $CsPbCl_3$, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

13. The method according to claim 3, wherein a host material of the quantum dot layer is CdS, CdSe, ZnSe, InP, PbS, CsPbCl3, $CsPbBr_3$, $CsPbI_3$, CdS/ZnS, CdSe/ZnS, ZnSe, InP/ZnS, PbS/ZnS, $CsPbCl_3$/ZnS, $CsPbBr_3$/ZnS, or $CsPbI_3$/ZnS.

14. The method according to claim 2, wherein the mixed solvent is composed of a benign solvent and a poor solvent of a host material of the quantum dot layer.

15. The method according to claim 3, wherein the mixed solvent is composed of a benign solvent and a poor solvent of a host material of the quantum dot layer.

\* \* \* \* \*